United States Patent [19]

Onuma et al.

[11] Patent Number: 5,665,980
[45] Date of Patent: Sep. 9, 1997

[54] FABRICATION METHOD OF SUPERCONDUCTING QUANTUM INTERFERENCE DEVICE CONSTRUCTED FROM SHORT WEAK LINKS WITH ULTRAFINE METALLIC WIRES

[75] Inventors: Yoshio Onuma, Nagano; Katsuyoshi Hamasaki, Nagaoka, both of Japan

[73] Assignee: Shinko Electric Industries Co., Ltd., Nagano, Japan

[21] Appl. No.: 259,156

[22] Filed: Jun. 13, 1994

Related U.S. Application Data

[63] Continuation of Ser. No. 961,169, Oct. 16, 1992, abandoned.

[30] Foreign Application Priority Data

Oct. 18, 1991 [JP] Japan ................................. 3-299802
Oct. 18, 1991 [JP] Japan ................................. 3-299803

[51] Int. Cl.⁶ ................................................. H01L 29/06
[52] U.S. Cl. ........................ 257/35; 257/34; 257/33; 505/190; 505/191
[58] Field of Search .......................... 427/63; 257/31, 257/32, 33, 34, 35, 36, 37, 38, 39

[56] References Cited

U.S. PATENT DOCUMENTS 4,560,435 12/1985 Brown et al. .............................. 156/643

OTHER PUBLICATIONS

Broom et al., "Josephson Junctions of Small Area Formed on the Edges of Niobium Films", Appl. Phys. Lett., vol. 37, No. 2, Jul. 15, 1980, pp. 237–239.
Iwanyshyn et al., "A Study of Evaporated Superconducting Weak–Link Junctions", Canadian Journal of Physics, vol. 48, 1970, pp. 470–476.
Hunt et al., "NbN/MgO/NbN Edge–Geometry Tunnel Junctions", Appl. Phys. Lett, vol. 55, No. 1, Jul. 3, 1989, pp. 81–83.

Track et al., "Modulation of the Penetration Depth of Nb and NbN Films by Quasiparticle Injection", IEEE Trans. on Mag. vol. 25, No. 2, Mar. 1989, pp. 1096–1099.
Abe et al., "Fabrication of Thin Film Nb–(fine Nb wires)–NbN Weak Links for Superconducting Quantum Interference Device Applications", Applied Physics Letter, Aug. 31, 1992 pp. 1131–1133, vol. 61, No. 9.
Sprik et al., "Transient response to quasiparticle injected superconducting links," Applied Physics Letters, vol. 55, No. 5, 31 Jul. 1989, New York, NY, pp. 489–491.
Martinis et al., "Fabrication of ultrasmall Nb–AlO$_x$–Nb Josephson tunnel injections," Applied Physics Letters, vol. 57, No. 6, 6 Aug. 1990, New York, NY, pp. 629–631.
Huq et al., "Fabrication of sub–micron whole–wafer SIS tunnel junctions for millimeter wave mixers," IEEE Transactions on Magnetics, vol. 27, No. 2, Mar. 1991, pp. 3161–3164.
D. Pascal, "Simple Fabrication and Characterization of Thin–Film Niobium Squid's Working at 4.2 K," SQUID '80, ©1980 Walter de Gruyter & Co., Berlin • New York, pp. 417–422.
Hunt et al., "NbN/MgO/NbN edge–geometry tunnel junctions," Appl. Phys. Lett., vol. 55(1), Jun. 3, 1989, pp. 81–86.

Primary Examiner—Mahshid D. Saadat
Assistant Examiner—Jhihan Clark
Attorney, Agent, or Firm—Staas & Halsey

[57] ABSTRACT

A method of fabricating a superconducting quantum interference device (DC-SQUID) constructed from short weak links with untrafine wires. The method comprises the following steps: successive forming a niobium nitride film and a silicon nitride film on a substrate; oblique etching of the niobium nitride film and said silicon nitride film with respect to the substrate by a reactive ion etching process using a mixture of oxygen and $CF_4$ gases to form an olique edge; and successive forming a barrier thin film and a counter-electrode of niobium on the said edge. The short weak links wire fabricated by field evaporation technique. The counterelectrode material were field-evaporated and formed the conductive paths in the pinholes in the insulating thin film.

14 Claims, 4 Drawing Sheets

FABRICATION METHOD OF SUPERCONDUCTING QUANTUM INTERFERENCE DEVICE CONSTRUCTED FROM SHORT WEAK LINKS WITH ULTRAFINE METALLIC WIRES

This application is a continuation, of application Ser. No. 07/961,169, filed Oct. 16, 1992, now abandoned.

BACKGROUND OF THE INVENTION

1. Field of the Invention

The present invention relates to a method of fabricating a superconducting quantum interference device (SQUID) constructed from short weak links with ultrafine metallic wires. The principle of the fabrication of the ultrafine metallic wires is based on the field evaporation phemomenon of atoms of superconducting materials. An elastic field is applied to the submicron area edge-sandwich.

2. Description of the Related Art

A superconducting quantum interference device is capable of detecting a magnetic field with high sensitivity and has been used for the measurement of magnetic susceptibility, for the detection of nuclear magnetic resonance signals and for biomagnetic measurements. To fabricate thin film SQUIDS, it is necessary to use superconducting thin films of very high quality having a critical temperature which in principle is equal to that of a bulk superconductor, even if its thickness is in the range of several nanometers. When fabricating, for example, a weak link type Josephson element with the structure of a metallic bridge, nanometer patterning techniques are required, for forming a weak link of submicron dimensions (i.e., length, width and thickness). The length of a weak link should be up to three to five times the superconducting coherence length (e.g., 10 nm for Nb at 4.2K, 4 to 5 nm for NbN), which is a very severe condition to fulfil. On the other hand, when a tunnel junction is used as a SQUID element, the precise control of the thickness and uniformity of the tunnel barrier become crucially important.

Because, as follows from the above, the SQUID fabrication requires very advanced processing techniques, the widespread use of SQUIDS has been somewhat delayed. Only recently, the fluxmeters incorporating a tunnel type DC-SQUID have been applied for practical measurements of magnetic fields produced by the human brain.

FIG. 3 shows the general construction of a DC-SQUID. The DC-SQUID consists of two Josephson elements 6 and 7 connected in single loop 5. The DC-SQUID detects external magnetic fields passing through the loop due to the effect thereof on the interference of superconducting electrons moving across the Josephson elements 6 and 7. As a result, the current-voltage characteristic of the DC-SQUID varies periodically with external magnetic flux at the period $\Phi_0 = 2.07 \times 10^{-15}$ Wb. Such a current-voltage characteristic enables the measurement of magnetic flux with high sensitivity.

FIG. 5 shows an example of a DC-SQUID. There are shown the counter electrode 8 forming the superconducting loop, the base electrode 9 formed at the open end of the loop, junction windows 10 in which weak links 11 are formed between the counter electrode 8 and the base electrode 9, and an input coil for coupling signal magnetic flux to SQUID loop. The signal magnetic flux may be detected through the variation of the voltage between the counter and base electrodes 8 and 9.

A Josephson element that exhibits the Josephson effect is formed by weakly linking two superconductors. Josephson elements are classified into those of a tunnel junction type, a weak link type (bridge type), a proximity effect type and a point-contact type. Various methods of fabricating Josephson elements have been proposed. FIGS. 4(a) to 4(d) show an example of the fabrication steps of an edge tunnel type Josephson element as disclosed in Appl. Phys. Lett. 55 81 (1989). To get a small area junction, for a high sensitivity DC-SQUID, the tunnel type Josephson element is prepared on the oblique edge of the superconductive NbN film and consists of NbN/MgO/NbN trilayer. First, as shown in FIG. 4(a), a niobium nitride layer 14 and an aluminum layer 15 as connection electrodes are formed by vacuum evaporation, an alumina film 16 is formed to protect the niobium nitride layer 14 as shown in FIG. 4(b), the niobium nitride film is etched to form an edge as shown in FIG. 4(c), and then, a MgO barrier thin film and a niobium nitride counterelectrode 17 are formed as shown in FIG. 4(d). The niobium nitride layer 14 serves as a base electrode. The niobium nitride layer 14, the counterelectrode 17 and the MgO barrier thin film formed between the niobium nitride layer 14 and the counterelectrode 17 constitute an edge tunnel junction 18 using edge of NbN film.

A DC-SQUID is obtained by forming two Josephson elements in a superconducting loop. As is generally known, the minimum detectable magnetic flux, which can be detected by the DC-SQUID, decreases with a reduction of the loop inductance $L_s$ and the capacitances of the Josephson junction elements. However, the loop inductance $L_s$ cannot be arbitrarily reduced because the efficiency of magnetic flux transfer between the pick-up coil and the DC-SQUID loop must be held at a proper level. Accordingly, the capacitances C of the Josephson elements need to be reduced to reduce the minimum detectable magnetic flux.

The capacitance C of the edge tunnel type Josephson element is dependent on a ratio A/d, where A is the area of the counterelectrode and d is the thickness of the tunnel barrier. Therefore, the capacitance can be reduced by decreasing the area A and increasing the thickness of tunnel barrier d. However, the characteristics of the tunnel type Josephson element limit the thickness d to a value not greater than about 1-2 nm. Accordingly, the prior art DC-SQUID has a small-area Josephson junction provided with a barrier thin film having a thickness on the order of 1 nm.

It is not easy to form such thin film. So, it is very desirable to develop a fabrication technology which is much less dependent on the barrier properties.

Fabricating the Josephson element with a small area is effective for preventing magnetic flux trapping in the junction and is achieved by using the edge of a thin film as shown in the example of FIG. 4.

The thickness of the barrier film of the tunnel type Josephson element is on the order of about 1 nm. A change of about 0.5 nm in the thickness of the barrier film will cause one order of magnitude change in the critical current density. Advanced technology is required for controlling the barrier thickness accurately to 0.1 nm. The adjustment of the thickness of the barrier thin film is an important technical problem when fabricating a tunnel-type DC-SQUID and thus the fabrication of a DC-SQUID requires precision processing techniques in forming the superconducting and insulator (tunnel barrier) layers.

If the pair of Josephson elements formed in the loop of a DC-SQUID do not have equal characteristics, the sensitivity of the DC-SQUID decreases. Hence, the DC-SQUID must be fabricated with a pair of Josephson elements which have equal characteristics. However, as mentioned above, the characteristics of a Josephson element are very difficult to control. So far, a DC-SQUID with weak links has not reproduced the performance level of a SQUID. Furthermore, it is very difficult to form two Josephson elements having equal characteristics. Tunnel-type DC-SQUIDS have been also fabricated by only few advanced companies with control of the tunnel barrier to be accurate to 0.1 nm. In the prior art a DC-SQUID with a tunnel has been provided with an external shunt resistor to cancel the large capacitance within, however, requires a complicated process for forming the DC-SQUID.

SUMMARY OF THE INVENTION

An object of the present invention is to fabricate a high quality, short weak link-type Josephson element reproducibly achieving SQUID performance, and to provide a SQUID employing a barrier film with a thickness greater than that of tunnel junctions. Using this method, one can fabricate the SQUIDS without sacrificing the capability of magnetic flux detection, provide a pair of Josephson junctions capable of being easily formed with equal characteristics in a loop, capable of being easily fabricated while not requiring any external shunt resistor, and provide a method for fabricating such a superconducting quantum interference device.

According to the present invention, a fabrication method of a superconducting quantum interference device (DC-SQUID) constructed from short weak links with ultrafine metallic wires comprises the following steps: successive forming of a niobium or niobium compound layer and an insulation film layer on a substrate; etching of the niobium or niobium compound layer and the insulation layer by a reactive ion etching process using a mixture of oxygen and $CF_4$ gases to form an oblique edge; and successive forming of a insulating thin film and a niobium counterelectrode on the oblique edge. The niobium compound layer is a niobium nitride or niobium carbon layer. It is also preferable that the insulation layer is a silicon nitride film.

The niobium nitride layer (or niobium carbon layer) and the silicon nitride film formed on the substrate are etched by a reactive ion etching process using a mixture of oxygen and $CF_4$ gases. Since the niobium nitride and silicon nitride have respective, substantially equal etching rates, the niobium nitride layer and the silicon nitride film can be efficiently etched obliquely. Thus, a high quality short weak link-type Josephson element with ultrafine metallic wires can be easily fabricated.

The present invention further provides, to achieve the object stated above, a superconducting quantum interference device (DC-SQUID) constructed from short weak links with ultrafine metallic wires comprising a loop connecting two weak link type Josephson elements each having a edge-sandwich consisting of a base electrode layer, an counterelectrode layer and a insulating thin film formed between the base electrode layer and the counterelectrode layer; and many metallic conductive wires created in the insulator film forming each junction, in such a manner that the conductive path (wires) is formed in the direction of the thickness of the insulating thin film so as to link the base electrode layer and the counterelectrode layer together.

The present invention still further provides a fabrication method of a superconducting quantum interference device (DC-SQUID) provided with two weak link Josephson elements in one loop, the method comprising the following steps: forming a weak link with ultrafine wires and consisting of an insulating thin film formed between the edge of base electrode layer and a counterelectrode layer at each submicron area edge-sandwich of the loop; and forming many metallic conductive wires electrically linking said base electrode layer and the counterelectrode layer together in the submicron area edge-sandwiches by applying a voltage pulse across the said base electrode layer and the counterelectrode layer at a temperature at which these electrodes are superconducting, thereby to make the base electrode or the counterelectrode material evaporate into pinholes in the insulating thin film by field evaporation. The short weak links were fabricated by a field evaporation technique. The counterelectrode material was field-evaporated and formed the conductive paths (or wires) in the pinholes in the insulating thin film.

The nanometric bridge formed in the insulating thin film forming the junction of each Josephson element formed in the loop enables the barrier thin film to be formed so as to be relatively thick, reduces the capacitance C of the Josephson element and prevents flux trapping. Accordingly, a detectable minimum magnetic flux is small enough and hence the superconducting quantum interference device is capable of operating as a precision magnetic sensor. Since the characteristics of the Josephson element are not directly dependent on the thickness of the barrier thin film, the DC-SQUID can be very easily fabricated.

The creation of the nanometric bridges in the junctions of both the Josephson junction elements and the destruction of the nanometric bridges by Joule heating are balanced automatically when forming the nanometric bridges in the insulating thin films by field evaporation, in which a voltage is applied across the two weak link type Josephson elements of the loop and, consequently, a DC-SQUID having Josephson elements that are equivalent to each other in characteristics can be easily fabricated.

DESCRIPTION OF THE PREFERRED EMBODIMENT

Preferred embodiments of the present invention will now be described hereinafter with reference to the accompanying drawings.

FIGS. 1(a) to 1(e) are views explaining a superconducting quantum interference device (DC-SQUID) in a preferred embodiment according to the present invention and a fabrication method of the same superconducting quantum interference device in another embodiment according to the present invention. Although the DC-SQUID is provided with two short weak link type Jesephson elements in one loop, only one of the two Josephson elements is shown in FIGS. 1(a) to 1(e).

The Josephson elements of the DC-SQUID in this embodiment are the edge-sandwich type. As shown in FIG.

1(a), a magnesium oxide layer 22 about 20 nm thick is formed on a silicon substrate 20, and then a niobium nitride layer 24 about 100 nm thick and a silicon nitride layer 26 about 100 nm thick are formed successively in that order by reactive sputtering.

Figure 1A:
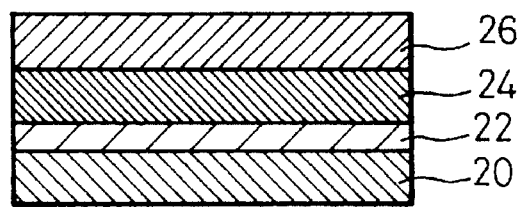
FIGS. 1(a) to 1(e) are sectional views explaining steps of a DC-SQUID fabricating method according to the present invention.
Figure 1B:
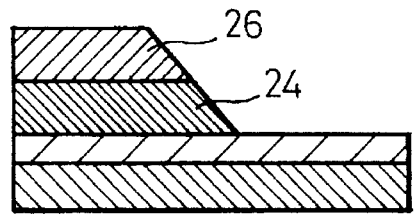

Then, a resist pattern is formed over the surface of the silicon nitride layer 26 by photolithography and the silicon nitride layer 26 and the niobium nitride layer 24 are etched to the surface of the magnesium oxide layer 22, to form an oblique edge as shown in FIG. 1(b), by reactive ion etching using the resist pattern as a mask and an etching gas of $CF_4$ and 10% $O_2$.

Since silicon nitride and niobium nitride are etched at substantially the same etching rate by the etching gas $CF_4$ and 10% $O_2$, the niobium nitride layer 24 and the silicon nitride layer 26 can be easily and obliquely etched as shown in FIG. 1(b). The inclination of the edge can be regulated by regulating the pressure of Oxygen gas during the etching process.

Figure 1C:
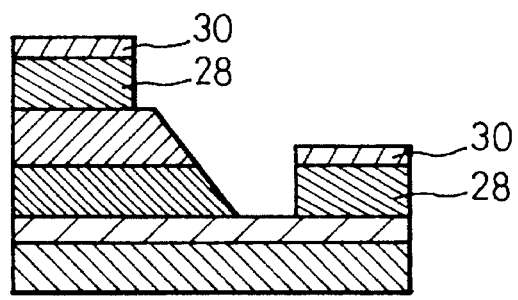

Then, a silicon nitride layer 28 and a magnesium oxide layer 30 are formed as shown in FIG. 1(c) to form a window in a region in which an edge-sandwich is to be formed. The window is about 2 μm in width and about 0.2 μm² in area.

Figure 1D:
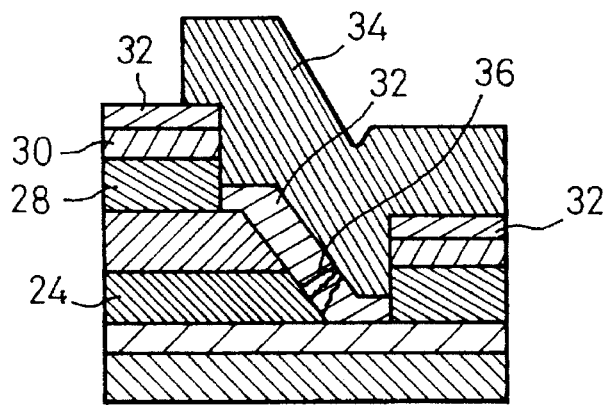

Then, after cleaning the edges of the niobium nitride layer 24 and the silicon nitride layer 26 by sputtering, a magnesium oxide layer 32 about 10 nm thick and a niobium layer 34 about 400 nm thick are formed by sputtering as shown in FIG. 1(d).

Thus, an edge-sandwich of the niobium nitride layer 24, the magnesium oxide layer 32 and the niobium layer 34 are formed. The magnesium oxide layer 32, the niobium nitride layer 24 and the niobium layer 34 serve as a barrier thin film, a base electrode and a counterelectrode, respectively. The counterelectrode is formed in a predetermined pattern by reactive ion etching using a resist pattern formed by photolithography. The electrical resistance of the junction is 1MΩ or above, and this junction is not a tunnel junction, i.e., it is an edge-sandwich.

Figure 1E:
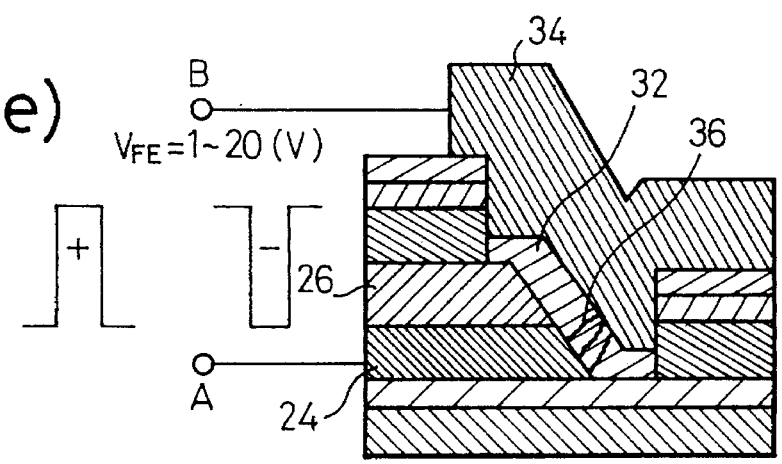

After forming the edge-sandwich as shown in FIG. 1(d), the workpiece is immersed in liquid helium, and then a pulse voltage is applied across the base electrode A and the counterelectrode B as shown in FIG. 1(e) to create a nanometric bridge 36 in the magnesium oxide layer 32, i.e., the barrier thin film.

This process of creating the nanometric bridge (i.e., short weak links with ultrafine metallic wires) by applying the pulse voltage across the base electrode A and the counterelectrode B is a field evaporation process. When an electric field with a field intensity of the order of $10^7$ V/cm is applied across the electrodes, niobium or niobium nitride forming the electrode diffuses into the insulating thin film by field evaporation so as to create a nanometric bridge in the insulating thin film. The evaporated niobium or niobium nitride grows in voids (i.e., pinholes) in the magnesium oxide layer 32 to electrically interconnect the electrodes.

When a film of an insulating material, such as magnesium oxide or aluminum oxide, is formed by a RF sputtering process, minute voids, or pinholes, are formed naturally in the film. The field evaporation process utilizes the minute voids (or pinholes) for creating the nanometric bridge. The insulating material for forming the barrier thin film is not limited to any particular insulating material.

The other weak-link type Josephson element of the conductive loop is formed by the same procedure. Actually, both Josephson elements are formed simultaneously in a vacuum vessel, and then a pulse voltage is applied simultaneously to the respective edge-sandwich of the pair of Josephson elements as shown in FIG. 1(e), so that similar nanometric bridges are created in the respective insulating thin films of the two junctions, respectively.

The creation of equivalent nanometric bridges in the junctions and the automatic critical current regulating mechanism are significant features of this nanometric bridge It creating method, which applies a voltage simultaneously to the pair of barrier thin films so as to create the nanometric bridges by field evaporation.

The method in accordance with the present invention, utilizing the automatic critical current regulating mechanism, is capable of easily fabricating a DC-SQUID having two Josephson elements having equivalent characteristics.

The pulse voltage applied across the electrodes when carrying out the nanometric bridge creating method is 20 V or below. Since a surge voltage, which is applied to the DC-SQUID in practical operation of the DC-SQUID, not higher than the voltage used in fabricating the DC-SQUID is not able to change the characteristics of the DC-SQUID, the DC-SQUID of the present invention has high surge voltage resistance.

Figure 2:
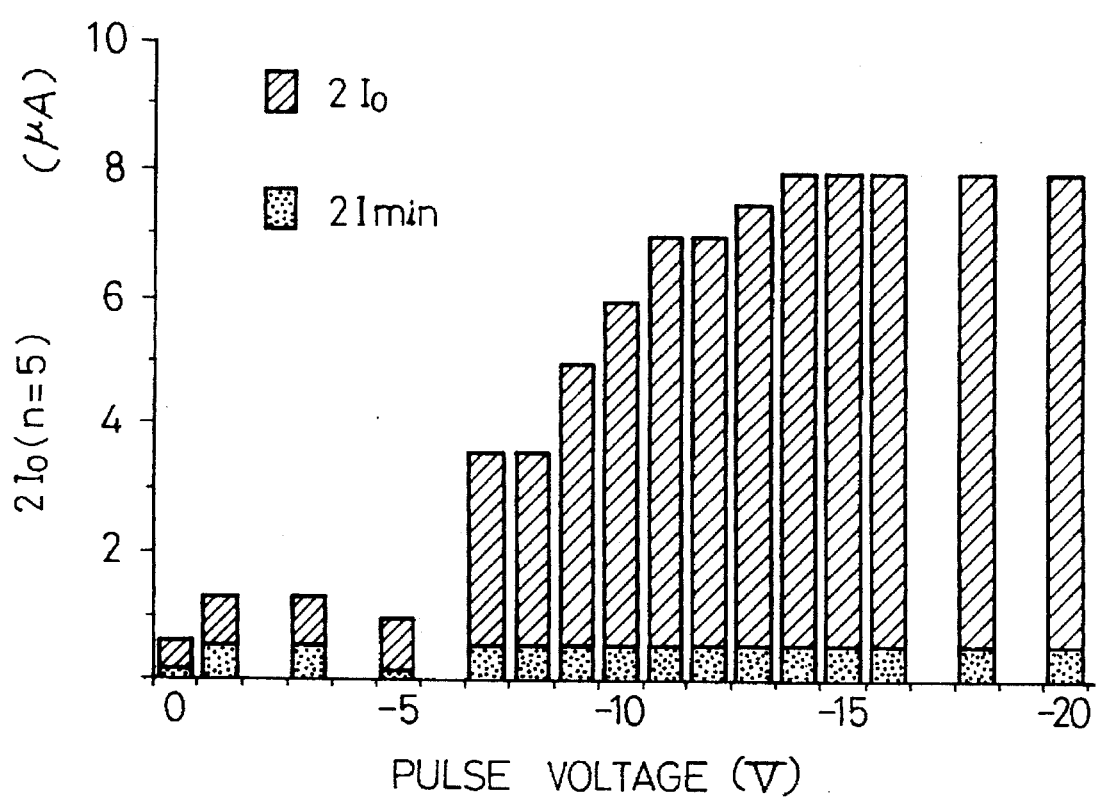
FIG. 2 is a graph showing a characteristic difference between a pair of junction elements.
Figure 3:
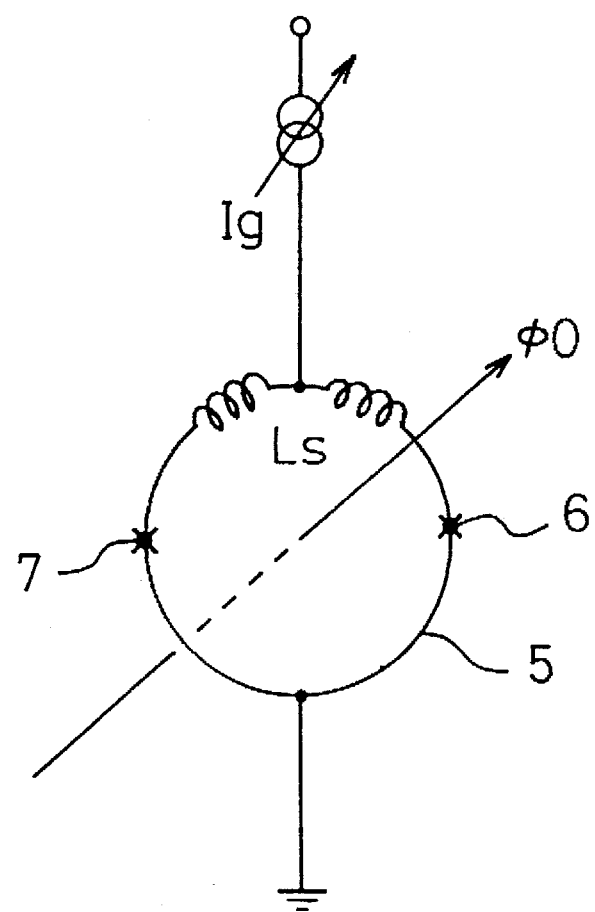
FIG. 3 is a diagrammatic view explaining the configuration of a DC-SQUID.
Figure 4A:
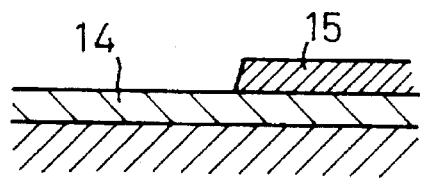
FIGS. 4(a) to 4(d) are sectional views explaining a DC-SQUID known in the prior art.
Figure 4B:
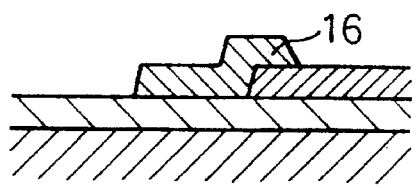
Figure 4C:
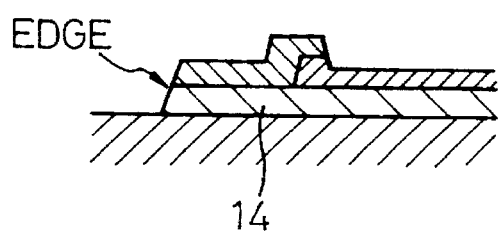
Figure 4D:
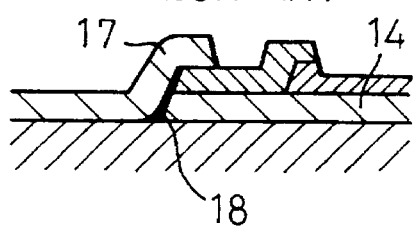

FIG. 2 shows the relation between the pulse voltage applied across the electrodes A and B for field evaporation and the inequality represented by critical currents $2I0$ and $2I_{min}$ as parameters between the two Josephson elements of the DC-SQUID. It is known from FIG. 2 that the degree of inequality is large when the pulse voltage is low, and the degree of inequality is small when the pulse voltage is about 14 V or above.

Figure 5:
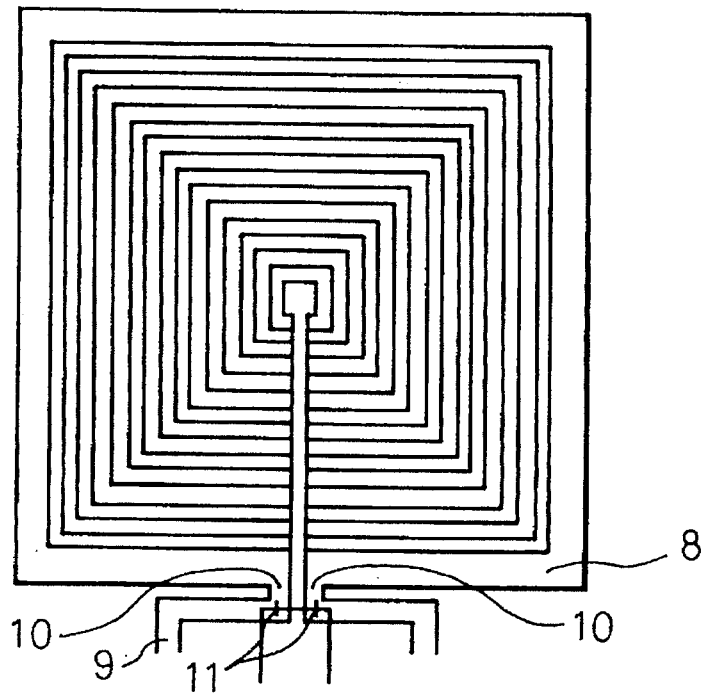
FIG. 5 is a perspective view explaining a prior art DC-SQUID.

After the nanometric bridges have been created in the insulating thin films as shown in FIG. 1(e), the workpiece is subjected to a reactive ion etching process to form a SQUID hole. Practically, a conductive film forming the loop of the DC-SQUID, such as the first electrode 8 shown in FIG. 5, is formed on the substrate, and then the weak-link type Josephson elements are formed when fabricating the DC-SQUID. Accordingly, the DC-SQUID can be completed by forming the SQUID hole to form the loop after forming the Josephson elements.

The foregoing DC-SQUID fabricating method is capable of forming the nanometric bridges (short weak links with ultrafine metallic wires) for the Josephson effect regardless of the thickness of the insulating thin films formed in the junctions of the Josephson elements. Therefore, the thickness of the insulating thin film may be relatively large. For example, the thickness of the insulating thin film employed in the edge-sandwich type (not the tunnel junction, but an insulating junction) DC-SQUID may be about ten times that of the insulating thin film employed in the ordinary edge tunnel type Josephson junction element. Accordingly, conditions for controlling the thickness of the insulating thin film are relaxed and thereby difficulty of fabricating the DC-SQUID is greatly reduced.

Since the barrier thin film may be relatively thick, the interval d between the surfaces can be increased so as to reduce the capacitance C effectively, which greatly enhances the ability of the DC-SQUID to detect the requisite minimum magnetic fluxes.

Since the nanometric bridges are created in the insulating thin films of the pair of Josephson elements on the loop by the automatic occurrence of the creation of the nanometric bridges and the destruction of the nanometric bridges when fabricating the DC-SQUID by the DC-SQUID fabricating method of the present invention, the DC-SQUID having the Josephson elements having equivalent characteristics can be easily fabricated and the percent of defective devices produced by the DC-SQUID fabricating process of the invention is effectively reduced from the conventional.

As is apparent from the foregoing description, the superconducting quantum interference device of the present invention has a pair of Josephson elements having equivalent characteristics and having a submicron area in a loop, the insulating thin films therein being relatively thick and hence having a relatively small capacitance. Since the Josephson elements have a submicron area, noise attributable to magnetic flux trapped at the junctions is very small and the superconducting quantum interference device is superior in characteristics to the prior art DC-SQUID.

We claim:

1. A superconducting quantum interference device (DC-SQUID) comprising:

two weak link type Josephson elements interconnected in a loop;

each of said two weak link type Josephson elements comprising:

an insulating base support structure having a base electrode layer therein, the base electrode layer being formed on a lower portion of the insulating base support structure and having an upper surface covered by an upper portion of the insulating base support structure, a window extending through the upper portion of the insulating base support structure and the base electrode layer and defining an exposed, oblique end face of the base electrode layer, an insulating barrier film, formed by sputtering, on the oblique end face of the base electrode layer, and a counterelectrode extending into the window and formed on the insulating barrier film and defining therewith an edge-sandwich Josephson element, the insulating barrier film having pinholes extending therethrough; and means for connecting the two weak link type Josephson elements for simultaneously conducting a pulsed current therethrough and forming a nanometric bridge in each thereof, extending through the pinholes in the insulating barrier film and comprising field evaporated material, of one of the base electrode layer and the counterelectrode layer, transferred into and filling the pinholes and thereby electrically linking the base electrode layer with the counterelectrode layer of the device and providing a superconductive link between the base electrode layer and the counterelectrode layer, the respective nanometric bridges having equivalent electrical characteristics.

2. A superconducting quantum interference device (DC-SQUID) as claimed in claim 1, wherein the window defines a common, exposed oblique end face of the upper portion of the insulating base electrode support structure and the base electrode layer.

3. A superconducting quantum interference device (DC-SQUID) as claimed in claim 2, wherein:

the upper portion of the insulating base support structure further comprises a first insulating layer segment, formed on an upper surface of the base electrode layer and having a common, exposed oblique end face with the base electrode layer and at least a second insulating layer formed on an upper surface of the first insulating layer and on an upper surface of the lower portion of the insulating base support structure, the window extending through the second insulating layer and defining first and second spaced vertical edge surfaces thereof, the first vertical edge surface being displaced from an upper edge of the common, oblique end face so as to expose a portion of the upper surface of the first insulating layer and the second vertical edge surface being displaced from a lower edge of the common oblique end face so as to expose a portion of the upper surface of the lower portion of the insulating base support structure; and the insulating barrier film, further, including a portion extending from the upper edge of the oblique end face and onto and along the exposed portion of the first insulating layer to the first vertical edge surface and from the lower edge of the oblique end face and onto and along the exposed portion of the upper surface of the lower portion of the insulating base support structure and to the second vertical edge surface.

4. A superconducting quantum interference device (DC-SQUID) constructed from short weak links interconnected by metallic fine wire conductive paths, comprising:

a loop connecting two weak link type Josephson elements each having an edge-sandwich and comprising a base electrode layer, a counterelectrode layer and an insulating thin film having opposite major surfaces defining a thickness thereof and formed between and separating, in accordance with the thickness of the insulating thin film, said base electrode layer and said counterelectrode layer, said insulating thin film having pinholes therein; and plural metallic fine wires comprising field evaporated material of one of the base electrode and counterelectrode layers, said fine wires extending through the pinholes in, and in a direction through the thickness of, said insulating thin film and linking said base electrode layer and said counterelectrode layer together.

5. A superconducting quantum interference device (DC-SQUID) comprising:

two weak link type Josephson elements interconnected in a loop;

each of said two weak link type Josephson elements comprising an edge-sandwich of a base electrode layer, a counterelectrode layer and an insulating film, the insulating film having opposite major surfaces defining a thickness thereof and being disposed between and interconnecting the base electrode layer and the counterelectrode layer, said insulating thin film having pinholes therein; and a nanometric bridge comprising field evaporated material of one of the base electrode layer and the counterelectrode layer transferred into and filling the pinholes in, and extending through the insulating thin film in a direction of the thickness thereof and between the opposite major surfaces thereof and forming a superconductive link between the base electrode layer and the counterelectrode layer.

6. A superconducting quantum interference device as recited in claim 5, wherein the insulating thin film layer has a thickness of approximately 10 nm.

7. A superconducting quantum interference device as recited in claim 5, wherein:

the base electrode layer comprises niobium nitride, the counterelectrode layer, comprises niobium nitride, and the insulating thin film comprises magnesium oxide.

8. A superconducting quantum interference device as recited in claim 7, wherein the counterelectrode layer, comprising niobium nitride, has a thickness of approximately 400 nm.

9. A superconducting quantum interference device as recited in claim 5, wherein the base electrode layer has an oblique end face, the insulating thin film being formed, at one of the opposite major surfaces thereof, on the oblique end face of the base electrode and the counterelectrode layer being formed on the other opposite major surface of the insulating thin film, at least a surface portion of the counterelectrode layer being in opposed and substantially parallel relationship to the oblique end face of the base electrode.

10. A superconducting quantum interference device (DC-SQUID) comprising:

two weak link type Josephson elements interconnected in a loop;

each of said two weak link type Josephson elements comprising an edge-sandwich of a base electrode layer, a counter electrode layer and an insulating film, the insulating film having opposite major surfaces defining a thickness thereof and being disposed between and structurally interconnecting the base electrode layer and the counterelectrode layer, said insulating thin film having pinholes therein; and plural metallic conductive paths extending through the pinholes in the insulating thin film, in a direction of the thickness thereof, and forming a superconductive link between the base electrode layer and the counterelectrode layer.

11. A super conducting quantum interference device (DC-SQUID) comprising:

two weak link type Josephson elements interconnected in a loop;

each of said two weak link type Josephson elements comprising:

an insulating base support structure having a major upper surface, a base electrode layer formed on the major upper surface of the insulating base support structure and having an upper surface parallel to the upper major surface of the insulating base support structure and a generally planar end face disposed at an oblique angle relatively to the upper major surface of the insulating base support structure, a sputtered, insulating thin film having a first major surface formed on the oblique end face of the base electrode layer and an opposite, second major surface substantially parallel thereto and having pinholes therein extending between the first and second major surfaces thereof, a counterelectrode layer formed on the second major surface of the sputtered insulating film, and field evaporated material of one of the base electrode layer and the counterelectrode layer being transferred into and filling the pinholes and thereby forming a superconductive link extending through the insulating film and interconnecting the base electrode layer and the counterelectrode layer.

12. A superconducting quantum interference device as recited in claim 11, wherein the sputtered, insulating thin film layer has a thickness of approximately 10 nm.

13. A superconducting quantum interference device as recited in claim 11, wherein:

the base electrode layer comprises niobium nitride, the counterelectrode layer, comprises niobium nitride, and the insulating thin film comprises magnesium oxide.

14. A superconducting quantum interference device as recited in claim 13, wherein the counterelectrode layer, comprising niobium nitride, has a thickness of approximately 400 nm.

* * * * *

UNITED STATES PATENT AND TRADEMARK OFFICE
CERTIFICATE OF CORRECTION

PATENT NO. : 5,665,980
DATED : September 9, 1997
INVENTOR(S) : ONUMA et al.

It is certified that error appears in the above-identified patent and that said Letters Patent is hereby corrected as shown below:

Col. 6, lines 7-8, delete the paragraph break;
line 8, delete "It";
line 27, change "2IO" to --$2l_o$--.

Signed and Sealed this

Tenth Day of February, 1998

Attest:

BRUCE LEHMAN

Attesting Officer

Commissioner of Patents and Trademarks